United States Patent
Matsui et al.

(10) Patent No.: US 9,443,608 B2
(45) Date of Patent: Sep. 13, 2016

(54) SHIFT REGISTER HAVING MULTIPLE OUTPUT UNITS CONNECTED IN CASCADE AS DISPLAY DEVICE SCAN LINE DRIVING CIRCUIT

(75) Inventors: Masafumi Matsui, Kyoto (JP); Hitoshi Tsuge, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/396,524

(22) PCT Filed: Apr. 25, 2012

(86) PCT No.: PCT/JP2012/002824
§ 371 (c)(1),
(2), (4) Date: Oct. 23, 2014

(87) PCT Pub. No.: WO2013/160941
PCT Pub. Date: Oct. 31, 2013

(65) Prior Publication Data
US 2015/0116194 A1    Apr. 30, 2015

(51) Int. Cl.
G09G 3/36      (2006.01)
G11C 19/28    (2006.01)
G11C 19/18    (2006.01)
G09G 3/32      (2016.01)

(52) U.S. Cl.
CPC ............. *G11C 19/28* (2013.01); *G09G 3/3266* (2013.01); *G09G 3/3648* (2013.01); *G11C 19/184* (2013.01); *G09G 2300/0842* (2013.01); *G09G 2310/0286* (2013.01)

(58) Field of Classification Search
CPC ........................... G09G 2310/0286–2310/0291
USPC .................................................... 345/98–100
See application file for complete search history.

(56) References Cited

U.S. PATENT DOCUMENTS

| 5,222,082 A | 6/1993 | Plus |
| 5,949,398 A | 9/1999 | Kim |
| 7,292,218 B2 | 11/2007 | Lin et al. |

(Continued)

FOREIGN PATENT DOCUMENTS

| JP | 6-505605 | 6/1994 |
| JP | 10-031202 | 2/1998 |

(Continued)

OTHER PUBLICATIONS

Bae et al., "Level Shifter Embedded in Drive Circuits With Amorphous Silicon TFTs", IEEE Transactions on Electron Devices, vol. 53, No. 3, Mar. 2006, pp. 494-498.

(Continued)

*Primary Examiner* — Long D Pham
(74) *Attorney, Agent, or Firm* — Greenblum & Bernstein, P.L.C.

(57) ABSTRACT

A shift register includes unit circuits connected in a cascade, and each of the unit circuits includes a logic circuit, a first output unit, and a second output unit. The first output unit is a buffer amplifier for outputting a driving signal and includes: a first transistor for outputting a first voltage; and a second transistor for outputting a second voltage lower than the first voltage. The second output unit is a buffer amplifier for outputting a signal to a next unit circuit in the cascade and includes: a third transistor for outputting a third voltage; and a fourth transistor for outputting a fourth voltage lower than the third voltage. The second voltage is set at a potential higher than the fourth voltage.

5 Claims, 8 Drawing Sheets

(56) References Cited

U.S. PATENT DOCUMENTS

| | | |
|---|---|---|
| 8,269,713 B2 | 9/2012 | Furuta et al. |
| 8,334,719 B2 | 12/2012 | Koyama et al. |
| 8,427,417 B2 | 4/2013 | Koyama |
| 8,487,921 B2 | 7/2013 | Shimatani |
| 8,493,312 B2 | 7/2013 | Furuta et al. |
| 8,754,674 B2 | 6/2014 | Lee et al. |
| 2005/0104836 A1 | 5/2005 | Lin et al. |
| 2008/0068326 A1 | 3/2008 | Chen et al. |
| 2009/0295699 A1* | 12/2009 | Korenari ............ H01L 27/1214 345/92 |
| 2010/0134476 A1 | 6/2010 | Zebedee et al. |
| 2010/0141641 A1 | 6/2010 | Furuta et al. |
| 2010/0171728 A1 | 7/2010 | Han et al. |
| 2010/0231569 A1 | 9/2010 | Shimatani |
| 2010/0277206 A1 | 11/2010 | Lee et al. |
| 2011/0064186 A1 | 3/2011 | Koyama |
| 2011/0069044 A1* | 3/2011 | Lee ..................... G11C 19/28 345/204 |
| 2011/0091006 A1 | 4/2011 | Liu et al. |
| 2011/0115545 A1 | 5/2011 | Koyama et al. |
| 2011/0273416 A1 | 11/2011 | Bae et al. |
| 2011/0285675 A1 | 11/2011 | Amano et al. |
| 2012/0162187 A1* | 6/2012 | Lee ..................... G09G 3/007 345/212 |
| 2012/0307959 A1 | 12/2012 | Furuta et al. |
| 2013/0056763 A1 | 3/2013 | Koyama et al. |
| 2013/0266113 A1 | 10/2013 | Tsuge et al. |

FOREIGN PATENT DOCUMENTS

| | | |
|---|---|---|
| JP | 2001-160299 | 6/2001 |
| JP | 2005-149691 | 6/2005 |
| JP | 2009-245564 | 10/2009 |
| JP | 2010-527092 | 8/2010 |
| JP | 2010-210978 | 9/2010 |
| JP | 2010-262296 | 11/2010 |
| JP | 2011-065740 | 3/2011 |
| JP | 2011-086363 | 4/2011 |
| JP | 2011-124560 | 6/2011 |
| JP | 2012-009125 | 1/2012 |
| WO | 92/15992 | 9/1992 |
| WO | 2009/028716 | 3/2009 |
| WO | 2009/034749 | 3/2009 |
| WO | 2011/033909 | 3/2011 |
| WO | 2011/058852 | 5/2011 |
| WO | 2011/145666 | 11/2011 |

OTHER PUBLICATIONS

International Search Report, mailed Aug. 7, 2012, in corresponding Internation Application No. PCT/JP2012/002824.

Japan Office Action, mailed Nov. 10, 2015, in the corresponding Japanese Patent Application No. 2014-512014.

Japan Office Action, mailed May 31, 2016, in the corresponding Japanese Patent Application No. 2014-512014.

* cited by examiner

SHIFT REGISTER HAVING MULTIPLE OUTPUT UNITS CONNECTED IN CASCADE AS DISPLAY DEVICE SCAN LINE DRIVING CIRCUIT

TECHNICAL FIELD

The present invention relates to a shift register and a display device including the shift register as a scan line driving circuit.

BACKGROUND ART

A shift register is used as a scan line driving circuit of a display device such as an organic electroluminescence (EL) display device. Such a shift register includes, as its output stage, a buffer amplifier having a large current supply capability to drive a scan line. It is required to suppress through-current in the buffer amplifier. In general, a buffer amplifier includes two transistors connected in series. The transistors are mutually exclusively in ON state. The through-current is a leakage current flowing through the transistors in OFF (non-conducting) state. Suppressing the through-current will reduce wasteful power consumption.

Recently, it has become common that a shift register is manufactured of a single type of transistors (for example, n-type transistors) to save manufacturing cost. Shift registers thus manufactured are likely to have a large through-current compared to CMOS shift registers. Because of this, suppression of through-current (and thus power consumption) is demanded all the more strongly.

There have been various techniques for conventional shift registers proposed to meet the demand (see Patent Literature (PTL) 1). In PTL 1, a shift register includes cascaded unit circuits each including two buffer amplifiers connected in parallel as an output stage as shown in FIG. 13. One of the buffer amplifiers outputs a driving signal to a corresponding scan line, and the other outputs a signal to the next unit circuit. An output stage in a unit circuit is thus separated into two buffer amplifiers in order to suppress through-current caused by bluntness of a driving signal output to a load (a scan line having stray capacitance).

CITATION LIST

Patent Literature

[PTL 1] WO 2009/028716

SUMMARY OF INVENTION

Technical Problem

However, the technique described in PTL 1 has a problem that power consumption is still large because the suppression of through-current is insufficient.

The present invention has been conceived to address the problem. An object of the present invention is to provide a shift register and a display device which operate with even less power consumption.

Solution to Problem

In order to achieve the above-described object, there is provided a shift register according to the present invention. The shift register includes unit circuits connected in a cascade, the unit circuits each including a first output unit, a second output unit, and a logic circuit, the first output unit including: a driving output terminal for outputting a driving signal; a first transistor for applying a first voltage to the driving output terminal; and a second transistor for applying a second voltage lower than the first voltage to the driving output terminal, the second output unit including: an output-to-next terminal for outputting a signal to a next unit circuit in the cascade; a third transistor for applying a third voltage to the output-to-next terminal; and a fourth transistor for applying a fourth voltage lower than the third voltage to the output-to-next terminal, and the logic circuit including: a first signal generator unit configured to generate a first signal for switching the first transistor and the third transistor between a conducting state and a non-conducting state according to the signal provided from a preceding unit circuit in the cascade; and a second signal generator unit configured to generate a second signal for switching the second transistor and the fourth transistor between the conducting state and the non-conducting state according to the signal provided from the preceding unit circuit in the cascade, wherein the first transistor and the second transistor each have a current supply capability larger than a current supply capability of the third transistor and a current supply capability of the fourth transistor, and the second voltage is set at a fixed potential higher than the fourth voltage.

The present invention may also be implemented as a display device including the shift register as a scan line driving circuit.

Advantageous Effects of Invention

A shift register and a display device according to the present invention operate with power less than power required by conventional shift registers or conventional display devices.

Figure 1:
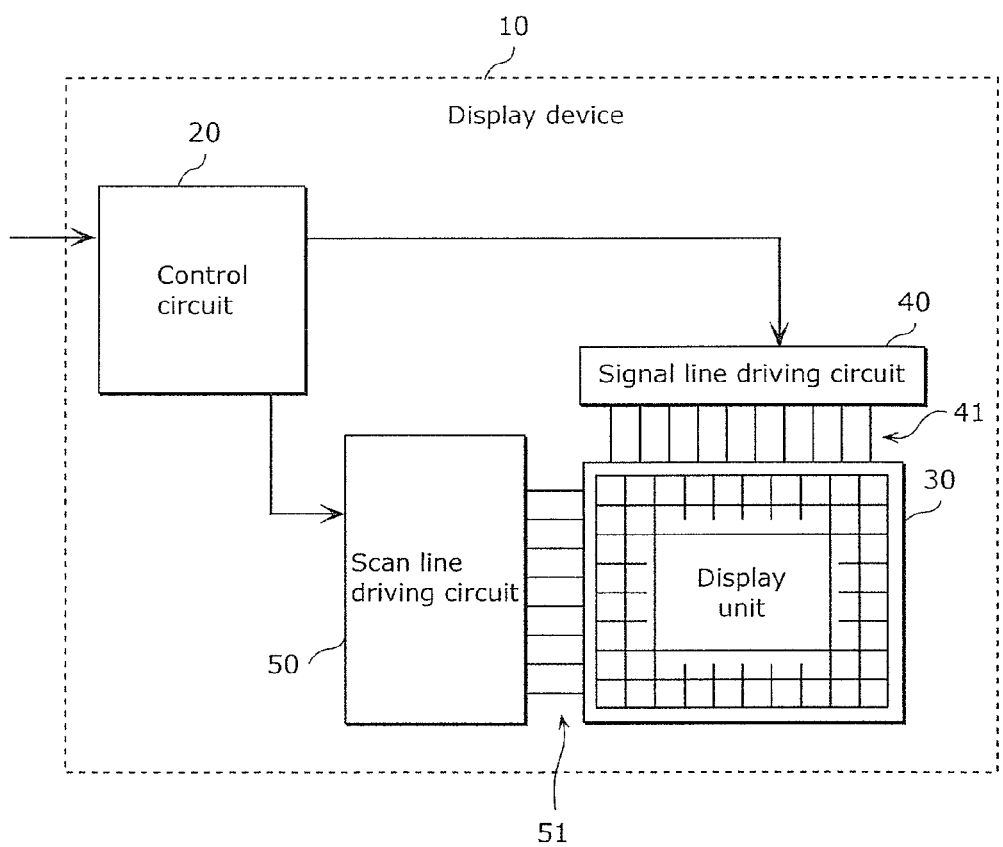
FIG. 1 is a block diagram illustrating a configuration of a display device in an embodiment of the present invention.

DESCRIPTION OF EMBODIMENTS (Underlying Knowledge Forming Basis of the Present Invention)

The inventors of the present invention found the following problem with the technique described in PTL 1 mentioned in the section of "Background Art."

In recent display devices manufactured with advanced techniques, shift registers may include transistors having a new type semiconductor layer which include an oxide. In general, the new type transistors are likely to be depletion-mode transistors. Such a depletion-mode transistor is not fully OFF and carries current even at zero gate-source voltage. When a buffer amplifier is driven, transistors included in the buffer amplifier are turned OFF generally by setting gate-source voltage to zero. Thus, since a shift register including such depletion-mode transistors cannot be turned OFF by setting gate-source voltage to zero, the technique described in PTL 1 has a problem of insufficient suppression of through-current.

Furthermore, displays with larger screen areas require buffer amplifiers including transistors with a larger current supply capability. Therefore, the buffer amplifiers include transistors of larger size. Accordingly, through-current also increases, having a high impact on power consumption.

A shift register according to an aspect of the present invention is provided in order to solve the problem. The shift register includes unit circuits connected in a cascade, the unit circuits each including a first output unit, a second output unit, and a logic circuit, the first output unit including: a driving output terminal for outputting a driving signal; a first transistor for applying a first voltage to the driving output terminal; and a second transistor for applying a second voltage lower than the first voltage to the driving output terminal, the second output unit including: an output-to-next terminal for outputting a signal to a next unit circuit in the cascade; a third transistor for applying a third voltage to the output-to-next terminal; and a fourth transistor for applying a fourth voltage lower than the third voltage to the output-to-next terminal, and the logic circuit including: a first signal generator unit configured to generate a first signal for switching the first transistor and the third transistor between a conducting state and a non-conducting state according to the signal provided from a preceding unit circuit in the cascade; and a second signal generator unit configured to generate a second signal for switching the second transistor and the fourth transistor between the conducting state and the non-conducting state according to the signal provided from the preceding unit circuit in the cascade, wherein the first transistor and the second transistor each have a current supply capability larger than a current supply capability of the third transistor and a current supply capability of the fourth transistor, and the second voltage is set at a potential higher than the fourth voltage.

With this, the first output unit, which drives a larger load, has a current supply capability larger than the current supply capability of the second output unit. At the same time, in the first output unit, which is likely to have a large through-current, the gate-source voltage Vgs input to turn the second transistor 81 OFF is a voltage biased more inversely than the voltage of the second output unit. Thus, even when the shift register is composed of depletion-mode n-type transistors, the through-current of the second transistor is suppressed while the second transistor is OFF.

The logic circuit may be connected to a high voltage source and a low voltage source for generating the first signal and the second signal, and the fourth voltage may be set at a potential same as output voltage of the low voltage source.

With this, the gate-source voltage of the second transistor turns negative when the second signal to switch the second transistor to the non-conducting state is input into the second transistor, so that through-current is securely suppressed.

Furthermore, the first transistor may include: a control terminal to which the first signal is input; a first output terminal; and a second output terminal connected to the driving output terminal, the first output terminal may be connected to a signal source of a clock signal having a high level at the first voltage and a low level at a voltage lower than the first voltage, and the logic circuit electrically may disconnect the control terminal and the first signal generator unit at least for a predetermined period starting immediately before the clock signal changes from the high level to the low level. More specifically, the shift register may further include a capacitor connected between the control terminal and the second output terminal of the first transistor, wherein potential of the control terminal may change from the fourth voltage to a voltage lower than the fourth voltage when the clock signal changes to the low level.

With this, the first signal generator unit and the gate of the first transistor are electrically disconnected for a predetermined period starting immediately before the clock signal being applied to the first transistor changes to the low level. Thus, when the clock signal passing through the first transistor falls, the change in the level of the clock signal is transmitted from the second output terminal of the first transistor to the control terminal via the capacitor, and thereby the potential of the control terminal of the first transistor falls. As a result, the gate and source of the first transistor are biased more inversely, so that through-current in the first transistor is suppressed.

Furthermore, the low level may be a potential same as the fourth voltage.

With this, when the clock signal is at the low level, the potentials at the ends of the first transistor and the second transistor connected in series are equal, so that no through-current flows.

The present invention is not implemented only as such shift registers but also as display devices including such shift register as scan line driving circuits. These general or specific aspects may be implemented as a plurality of circuits or as a single integrated circuit.

Embodiment

The following concretely describes a shift register and a display device according to an aspect of the present invention with reference to the drawings. The embodiment described below illustrates a concrete example of the present invention. The values, shapes, materials, constituent elements, layout and connection of the constituent elements, steps, and the order of the steps in the embodiment are given not for limiting the present invention but for illustrative purposes only. Among the constituent elements in the following embodiment, constituent elements not recited in the independent claim defining the most generic part of the concept of the present invention are described as arbitrary constituent elements in a preferable embodiment.

FIG. 1 is a block diagram illustrating a configuration of a display device 10 in an embodiment of the present invention.

The display device 10 is an organic EL display which provides a visual display for a video signal provided from an external source and includes a control circuit 20, a display unit 30, a signal line driving circuit 40, and a scan line driving circuit 50.

The control circuit 20 separates an externally-provided video signal into a synchronization signal and a pixel signal, and outputs the synchronization signal and the pixel signal to the scan line driving circuit 50 and the signal line driving circuit 40, respectively.

The display unit 30 is a display panel in which pixel circuits are arranged two-dimensionally.

The signal line driving circuit 40 provides a pixel signal received from the control circuit 20 to the display unit 30 via signal lines 40 running in a column-wise direction.

The scan line driving circuit 50 generates a driving signal for scan lines by shifting, using a shift register inside the scan line driving circuit 50, a synchronization signal received from the control circuit 20, and provides the driving signal to the display unit 30 via scan lines 51 running in a row-wise direction.

Figure 2:
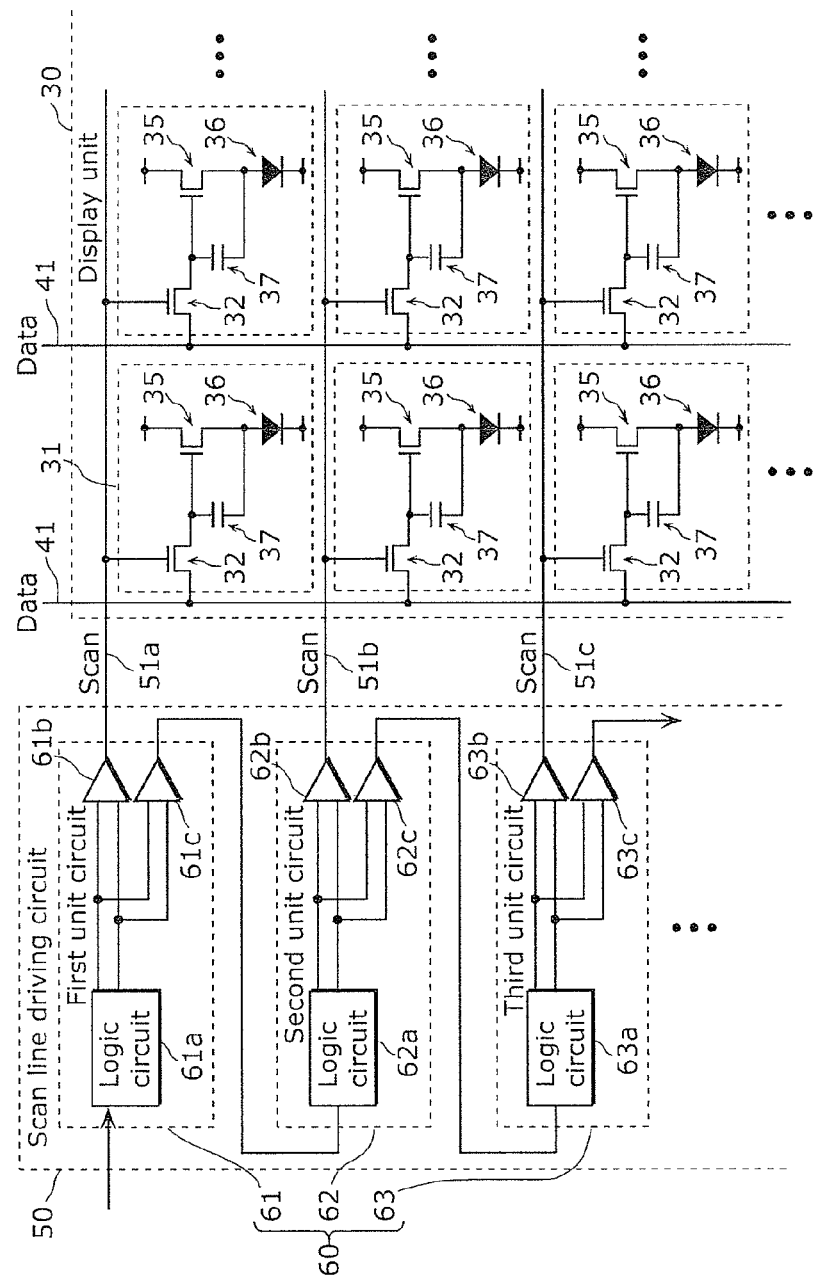
FIG. 2 illustrates connection of the scan line driving circuit illustrated in FIG. 1 and a display unit.

FIG. 2 illustrates connection of the scan line driving circuit 50 illustrated in FIG. 1 and the display unit 30.

The scan line driving circuit 50 includes a shift register 60 which outputs driving signals to the scan lines 51 (scan lines 51a, 51b, 51c . . . for signals Scan).

The shift register 60 includes unit circuits (a first unit circuit 61, a second unit circuit 62, a third unit circuit 63 . . . ) connected serially in a cascade. The first unit circuit 61 includes a logic circuit 61a, a first output unit 61b, and a second output unit 61c. The second unit circuit 62 includes a logic circuit 62a, a first output unit 62b, and a second output unit 62c. The third unit circuit 63 includes a logic circuit 63a, a third output unit 63b, and a third output unit 63c.

In each of the unit circuits included in the shift register 60, the first output unit (61b etc.) and the second output unit (61c etc.) each output a driving signal based on input of two control signals received from the corresponding logic circuit (61a etc.) The first output units (61b etc.) are buffer amplifiers which output driving signals for driving the scan lines 51 (51a to 51c). The second output units (61c etc.) are buffer amplifiers which output signals (shift-out signals) to the next unit circuit in the cascade.

The pixel circuits 31 included in the display unit 30 each include a switching transistor 32, a driving transistor 35, an organic electroluminescence (EL) device 36, and a capacitor 37 as illustrated in FIG. 2. The switching transistor 32 controls the capacitor 37 according to a signal Scan received from the scan line 51a so that the capacitor 37 does or does not hold a pixel signal (Data) received via the signal lines 41. The driving transistor 35 provides a current at a level according to a voltage held by the capacitor 37 to the organic EL device 36.

Figure 3:
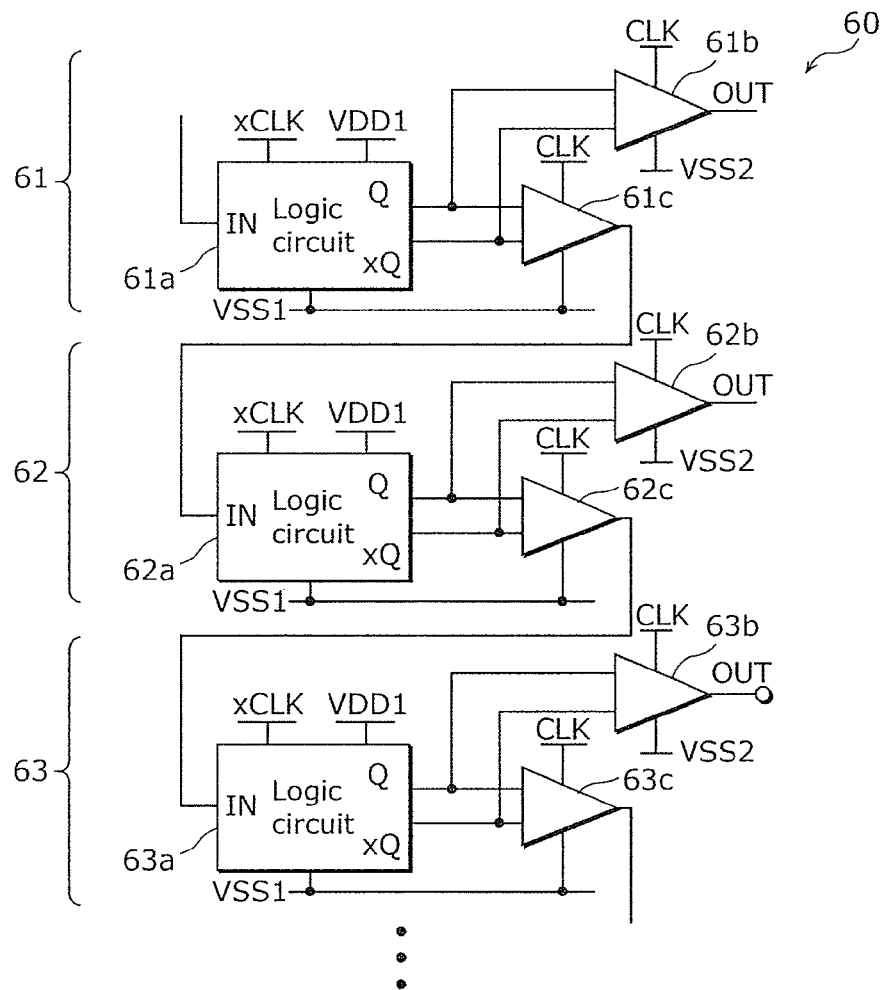
FIG. 3 illustrates a shift register included in the scan line driving circuit illustrated in FIG. 2.

FIG. 3 illustrates the shift register 60 included in the scan line driving circuit 50 illustrated in FIG. 2. FIG. 3 illustrates only first three unit circuits (first unit circuit 61, second unit circuit 62, first unit circuit 63) among the unit circuits connected in a cascade in the shift register 60.

The first unit circuit 61 includes the logic circuit 61a, the first output unit 61b, and the second output unit 61c. The second unit circuit 62 includes the logic circuit 62a, the first output unit 62b, and the second output unit 62c. The third unit circuit 63 includes the logic circuit 63a, the first output unit 63b, and the second output unit 63c. The unit circuits are common in circuit configuration and connections therebetween and other elements. The following therefore describes one of the unit circuits (first unit circuit 61).

The logic circuit 61a is connected to a source voltage VDD1, a reference voltage VSS1, and a signal source of a clock signal xCLK. The source voltage VDD1 is a high-voltage source, and the reference voltage VSS1 is a low-voltage source. The logic circuit 61a provides control signals (first signal and second signal) to the first output unit 61b and the second output unit 61c, which are connected in parallel, through two output terminals Q and xQ according to an input signal received through an input terminal IN. The input signal is a pulse signal indicating a horizontal synchronization period or a plurality of horizontal periods or, for unit circuits in the second stage or further downstream, a signal received from the unit circuit in the preceding stage.

The first output unit 61b is a buffer amplifier connected to a first voltage (in this case, a clock signal CLK) and a second voltage (in this case, a reference voltage VSS2). The first output unit 61b outputs a driving signal for driving the scan line 51 according to control signals (first signal and second signal) received from the logic circuit 61a. The high level of the driving signal output from the first output unit 61b is at a potential determined by the clock signal CLK, and the low level is at the potential of the reference voltage VSS2. Note that the reference voltage VSS2 is set at a potential higher than the reference voltage VSS1. Also note that the first output unit 61b has a current supply capability larger than that of the second output unit 61c.

The second output unit 61c is a buffer amplifier connected to a third voltage (in this case, a clock signal CLK) and a fourth voltage (in this case, a reference voltage VSS1). The second output unit 61c outputs a signal (shift-out signal) to the next unit circuit in the cascade according to control signals (first signal and second signal) received from the logic circuit 61a. The high level of the driving signal output from the second output unit 61c is at a potential determined by the clock signal CLK, and the low level is at the potential of the reference voltage VSS1.

In this manner, each of the unit circuits of the shift register 60 includes two buffer amplifiers (the first output unit and the second output unit) in its output stage. The two buffer amplifiers are connected in parallel and have different current supply capacities. Thus, the first output unit, which outputs a driving signal requiring a large current, and the second output unit, which outputs a signal requiring not a large current but a waveshape free from bluntness, are circuits capable of providing signals which meet the requirements. The shift register 60 thus configured provides a driving signal having sharp rises and falls compared to a shift register configured to output a driving signal and a signal to the next unit circuit in the cascade from a common output unit. This allows for high-speed driving of the display unit 30 having a high pixel density and suppresses through-current (power consumption) due to a blunt driving signal.

The reference voltage VSS2 connected to the first output unit 61b, which has a large current driving capacity, is set at a potential higher than the reference voltage VSS1 connected to the second output unit 61c, which has a small current driving capacity. Thus, the gate-source voltage of the transistor connected to the reference voltage VSS2 out of the transistors included in the first output unit 61b is inversely biased (Vgs<0) during OFF operation, so that the transistor is placed in a fully OFF state. Through-current of the transistor is thereby suppressed in the transistor.

Figure 4:
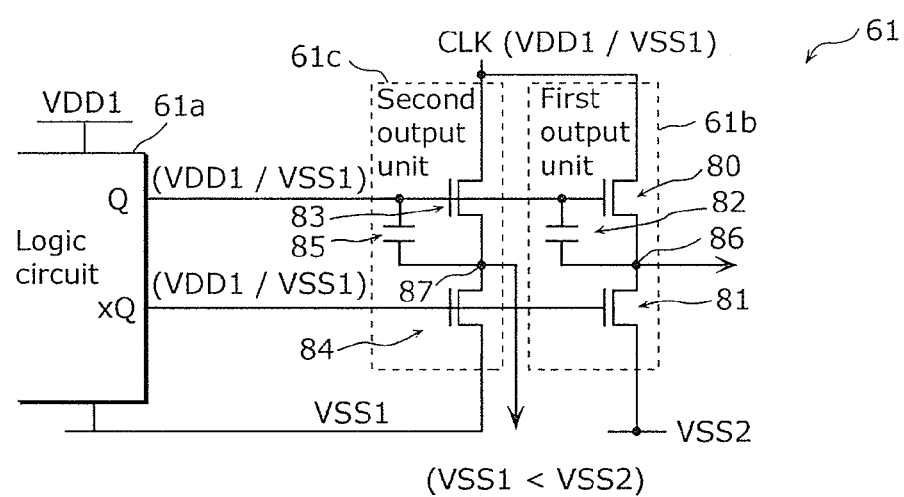
FIG. 4 is a circuit diagram illustrating a detailed configuration of a first output unit and a second output unit included in each unit circuit of the shift register illustrated in FIG. 3.

FIG. 4 is a circuit diagram illustrating a detailed configuration of the first output unit and the second output unit included in each of the unit circuits 61 to 63 of the shift register 60 illustrated in FIG. 3. The circuit illustrated in FIG. 4 is the circuit of the first unit circuit 61.

The first output unit 61*b* includes a driving output terminal 86, a first transistor 80, a second transistor 81, and a first capacitor 82. The driving output terminal 86 outputs a driving signal. The first transistor 80 is an n-type transistor for applying a first voltage (in this case, a clock signal CLK) to the driving output terminal 86. The second transistor 81 is an n-type transistor for applying a second voltage (in this case, a reference voltage VSS2) to the driving output terminal 86. The first capacitor 82 connects the gate and source of the first transistor 80. The second voltage is lower than the first voltage. The drain of the first transistor 80 is connected to the first voltage (in this case, the clock signal CLK), and the source of the first transistor 80 is connected to the driving output terminal 86 and the drain of the second transistor 81. The source of the second transistor 81 is connected to the second voltage (in this case, the reference voltage VSS2). The gate, source, and drain correspond to the control terminal, the first output terminal, and the second output terminal (or the control terminal, the second output terminal, and the first output terminal) of the transistor, respectively.

The second output unit 61*c* includes an output-to-next terminal 87, a third transistor 83, a fourth transistor 84, and a second capacitor 85. The output-to-next terminal 87 outputs a signal to the next unit circuit in the cascade, that is, the unit circuit 62. The third transistor 83 is an n-type transistor for applying a third voltage (in this case, a clock signal CLK) to the output-to-next terminal 87. The fourth transistor 84 is an n-type transistor for providing a fourth voltage (in this case, a reference voltage VSS1) to the output-to-next terminal 87. The second capacitor 85 connects the gate and the source of the third transistor 83. The fourth voltage is lower than the third voltage. The drain of the third transistor 83 is thus connected to the third voltage (in this case, the clock signal CLK), and the source of the third transistor 83 is connected to the output-to-next terminal 87 and the drain of the fourth transistor 84. The source of the fourth transistor 84 is connected to the fourth voltage (in this case, the reference voltage VSS1).

Compared to the third transistor 83 and the fourth transistor 84, the first transistor 80 and the second transistor 81 are large in size (specifically, given that the channel lengths are equal, the first transistor 80 and the second transistor 81 have larger channel widths) and therefore have a large current supply capability. 84.

The first transistor 80 and the third transistor 83 receive a first signal through the gate thereof from the logic circuit 61*a*. The first signal is generated by a first signal generator unit of the logic circuit 61*a* (the high level of the first signal is at a source voltage VDD1, and the low level is at a reference voltage VSS1). The first signal serves as a control signal for switching the first transistor 80 and the third transistor 83 between the conducting state (ON) and the non-conducting state (OFF).

The second transistor 81 and the fourth transistor 84 receive a second signal through the gate thereof from the logic circuit 61*a*. The second signal is generated by a second signal generator unit of the logic circuit 61*a* (the high level of the second signal is at a source voltage VDD1, and the low level is at a reference voltage VSS1). The second signal serves as a control signal for switching the second transistor 81 and the fourth transistor 84 between the conducting state (ON) and the non-conducting state (OFF).

The clock signal CLK is provided from a clock signal source (not illustrated) and has a high level at a source voltage VDD1 and a low level at a reference voltage VSS1.

The first capacitor 82 and the second capacitor 85 each form a bootstrap circuit to provide positive feedback to the first transistor 80 and the third transistor 83, respectively. More specifically, when the first transistor 80 (third transistor 83) is ON, the clock signal CLK passes through the first transistor 80 (third transistor 83) and is output to the driving output terminal 86 (output-to-next terminal 87). The change in the level of the clock signal CLK at rising (alternating-current component) is input as a positive feedback to the gate of the first transistor 80 (third transistor 83) through the first capacitor 82 (third transistor 83). This causes a rise in the potential of the gate of the first transistor 80 (third transistor 83), so that the gate-source voltage of the first transistor 80 (third transistor 83) is maintained during the rising of the clock signal CLK. The first transistor 80 (third transistor 83) thereby persistently remains in ON state and outputs a signal having a sharp rise from its source.

The reference voltage VSS2 is set at a potential higher than the reference voltage VSS1 for the following reason.

In the present embodiment, the four transistors (first transistor 80, second transistor 81, third transistor 83, and fourth transistor 84) composing the output stage of each of the unit circuits are depletion-mode n-type transistors, for example. In this case, such transistors are not fully OFF and allows a current to flow at zero gate-source voltage. It is therefore necessary to suppress through-current, especially through-current flowing through the first transistor 80 and the second transistor 81 of the first output unit 61*b* having a large current supply capability.

In the present embodiment, the source of the second transistor 81 is connected to the reference voltage VSS2, which is higher than the reference voltage VSS1, and the second signal input to the gate of the second transistor has the reference voltage VSS1 at the low level (at which the signal switches the second transistor 81 to the non-conducting state). Thus, when the second signal is at the low level, the gate and source of the second transistor 81 is inversely biased (Vgs<0). This places the second transistor 81 in a fully OFF state, and thereby through-current of the second transistor 81 is suppressed.

In the fourth transistor 84, the gate-source voltage becomes zero (Vgs=0) when the second signal input into the gate changes to the low level. In other words, the gate-source voltage of the fourth transistor 84 is not inversely-biased. The current supply capability of the fourth transistor 84 is so small (that is, the fourth transistor 84 is small in size) that through-current of the fourth transistor 84 is small (ignorable).

Figure 5:
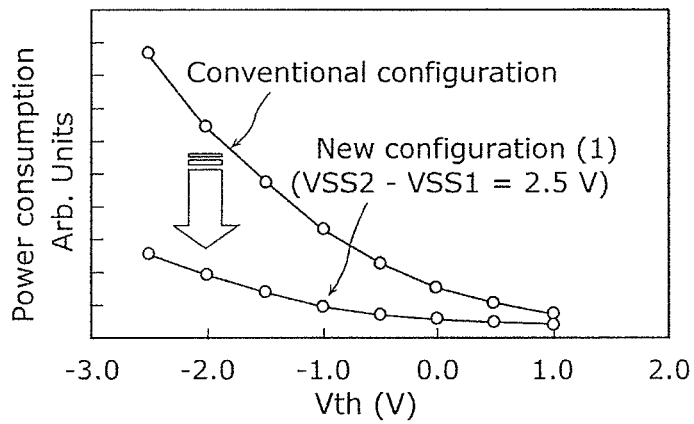
FIG. 5 is a graph showing an effect of a shift register including the circuit illustrated in FIG. 4.

FIG. 5 is a graph showing the effect of the shift register including the circuit illustrated in FIG. 4. The horizontal axis indicates threshold voltages Vth (V) of the transistors included in the shift register, and the vertical axis indicates power consumption of the shift register. In this graph, the curve for "Conventional configuration" shows data of a conventional shift register in which the reference voltage VSS2 and the reference voltage VSS1 are set to be equal (VSS2−VSS1=0 V), and the curve for "New configuration (1)" shows data of the shift register in the present embodiment in which the reference voltage VSS2 is set at a potential higher than the reference voltage VSS1 (in this case, VSS2−VSS1=2.5 V).

As can be seen from the two curves in FIG. 5, the shift register in the present embodiment, in which the reference voltage VSS2 is set at a potential higher than the reference voltage VSS1, consumes less power than the conventional shift register. In particular, reduction in power consumption increases as the threshold voltage of the transistor becomes more negative (in other words, the depletion mode is enhanced more).

The clock signal provided to the drain of the first transistor 80 and the clock signal provided to the drain of the third transistor 83, which are the same clock signal CLK in the exemplary circuit illustrated in FIG. 4, may be different clock signals.

Figure 6:
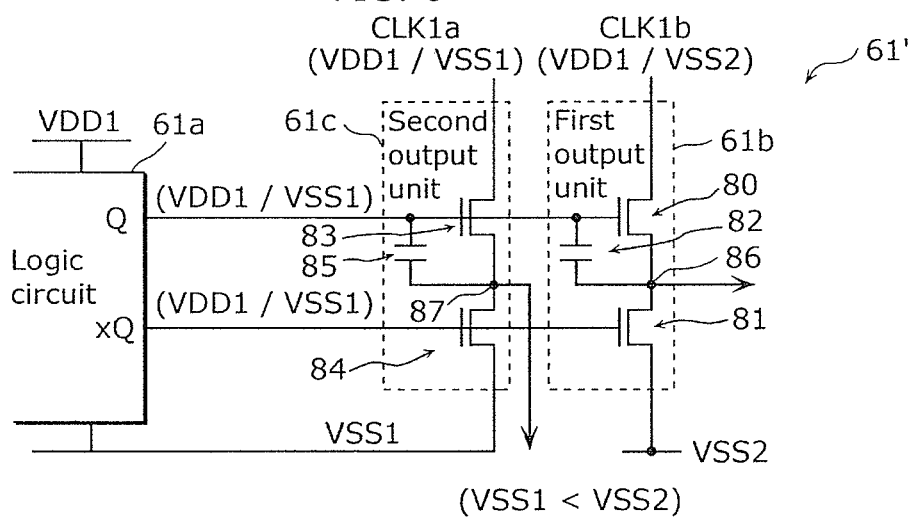
FIG. 6 is a circuit diagram illustrating a detailed configuration of a first output unit and a second output unit included in each unit circuit according to a variation.

FIG. 6 illustrates an output stage of a unit circuit 61' according to a variation, in which the drain of the first transistor 80 and the drain of the third transistor 83 are provided with different clock signals (CLK1*a*, CLK1*b*). In this case, the drain of the third transistor 83 is provided with the clock signal CLK1*a*, and the drain of the first transistor 80 is provided with the clock signal CLK1*b*. The clock signal CLK1*a* is an example of the third voltage, and the clock signal CLK1*b* is an example of the first voltage.

The clock signal CLK1*a* is the same as the clock signal CLK in FIG. 4. The high level of the clock signal CLK1*a* is at a source voltage VDD1, and the low level is at a reference voltage VSS1. The high level of the clock signal CLK1*b* is at a source voltage VDD1, and the low level is at a reference voltage VSS2. This means that the potential level of the clock signal CLK1*b* is the same as the potential level of the source of the second transistor 81.

Figure 7:
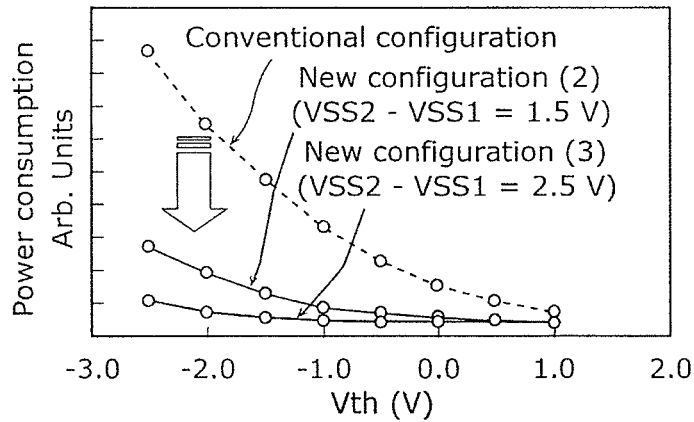
FIG. 7 is a graph showing the effect of a shift register including the circuit illustrated in FIG. 6.

FIG. 7 is a graph showing the effect of a shift register including the circuit illustrated in FIG. 6. The vertical axis and the horizontal axis each indicate the same as in FIG. 5. The curve for "Conventional configuration" in this graph is the same as the curve for "Conventional configuration" in FIG. 5. The curve for "New configuration (2)" shows data of the shift register in the present embodiment in which the reference voltage VSS2 is set to be higher than the reference voltage VSS1 (in this case, VSS2−VSS1=1.5 V). The curve for "New configuration (3)" shows data of the shift register in the present embodiment in which the reference voltage VSS2 is set to be even higher than the reference voltage VSS1 (in this case, VSS2−VSS1=2.5 V).

As can be seen from the three curves in FIG. 7, the larger the excess of the reference voltage VSS2 over the reference voltage VSS1 is, the larger the effect of power consumption reduction is. Furthermore, comparison of the curve for "New configuration (1)" in FIG. 5 and the curve for "New configuration (3)" in FIG. 7, for which the two reference voltages of VSS1 and VSS2 are the same (VSS2−VSS1=2.5 V), shows that changing the low level of the clock signal provided to the first transistor 80 from the reference voltage VSS1 to the reference voltage VSS2 allows for further reduction of power consumption. This is because no current (through-current) flows through the first transistor 80 and the second transistor 81 in the case where the low level of the clock signal provided to the drain of the first transistor 80 is at the potential same as the potential of the source of the second transistor 81 (reference voltage VSS2). In this case, when the clock signal is at low level, the potentials at the ends of a series of the first transistor 80 and the second transistor 81 are the same, and thus the potential difference between the ends are zero.

Figure 8:
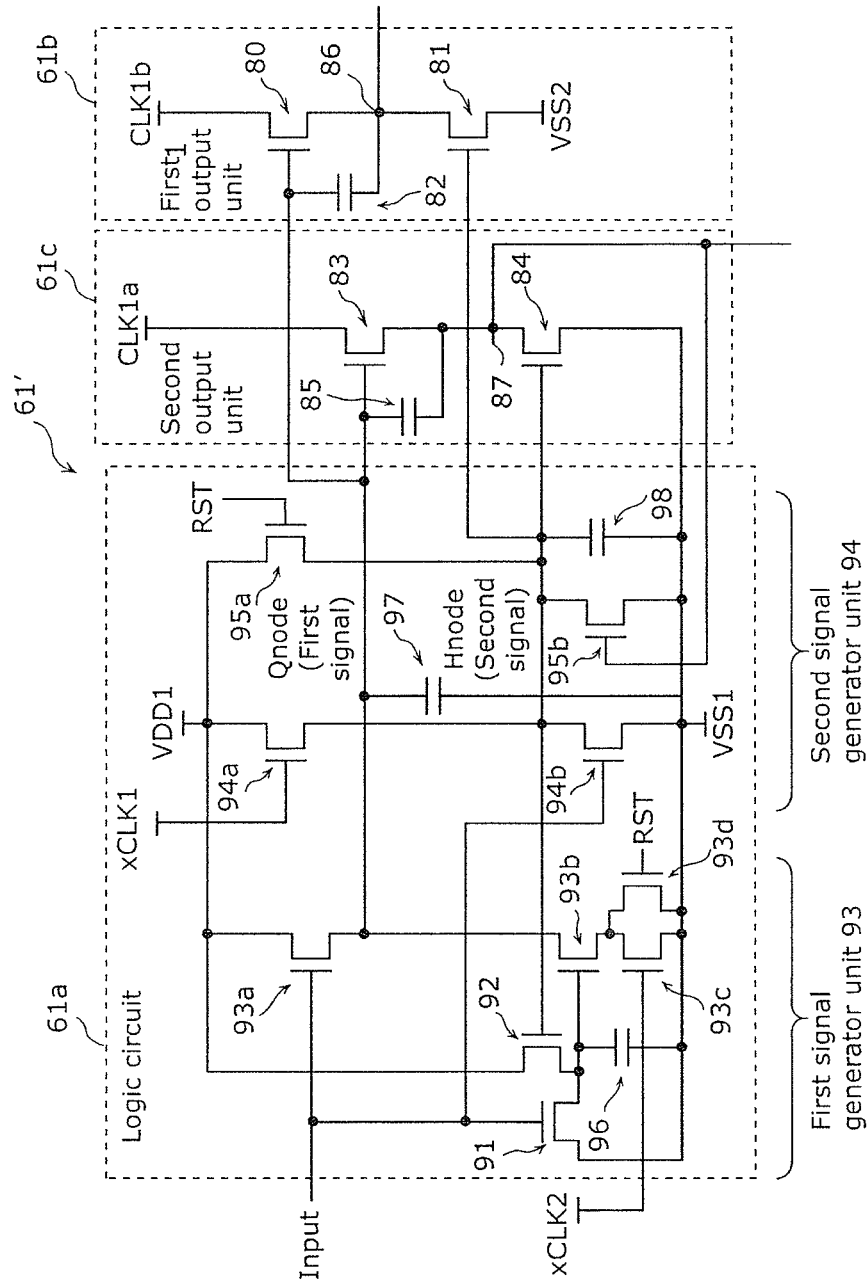
FIG. 8 is a detailed circuit diagram illustrating the unit circuit included in the shift register illustrated in FIG. 3.

FIG. 8 is a detailed circuit diagram illustrating the unit circuit (in this case, the first unit circuit 61' in FIG. 6) included in the shift register 60 illustrated in FIG. 3.

The logic circuit 61*a* includes ten transistors 91, 93*a* to 93*d*, 94*a*, 94*b*, 95*a*, and 95*b*, and three capacitors 96 to 98. The logic circuit 61*a* receives two clock signals xCLK1 and xCLK2 which are two-phase clock signals composing the above-described clock signal xCLK.

The transistors 91, 92, and 93*a* to 93*d* are included in a first signal generator unit 93 which outputs a first signal to a control line Qnode. The first signal is a signal for controlling switching of the first transistor 80, which is included in the first output unit 61*b*, and the third transistor 83, which is included in the second output unit 61*c*, between the conducting state and the non-conducting state.

The transistors 94*a*, 94*b*, and 95*a* to 95*b* are included a second signal generator unit 94 which outputs a second signal to a control line Hnode. The second signal is a signal for controlling switching of the second transistor 81, which is included in the first output unit 61*b*, and the fourth transistor 84, which is included in the second output unit 61*c*, between the conducting state and the non-conducting state.

Figure 9:
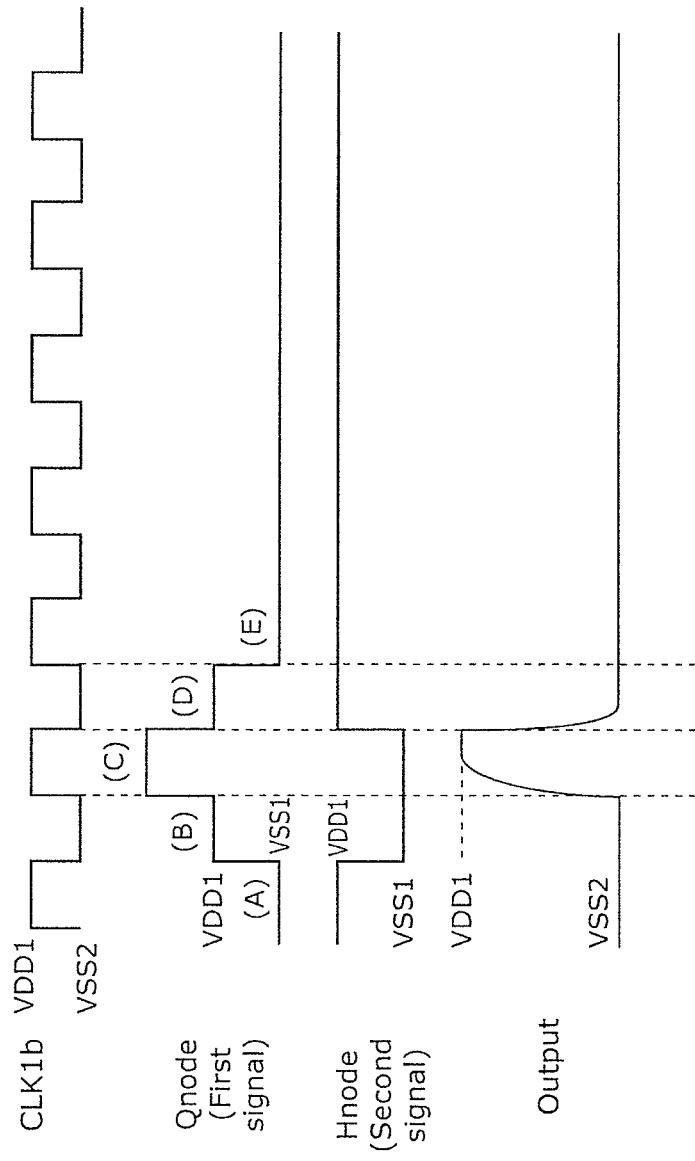
FIG. 9 is a timing diagram illustrating operation of a first unit circuit illustrated in FIG. 8.

FIG. 9 is a timing diagram illustrating operation of the first unit circuit 61' illustrated in FIG. 8. The diagram shows the waveform of the clock signal CLK1*b*, and the voltage waveforms on the control line Qnode (the first signal), on the control line Hnode (the second signal), and at the driving output terminal 86.

In the period (A) shown in FIG. 9, the first signal generator unit 93 turns the control line Qnode down to the low level (reference voltage VSS1), and the second signal generator unit 94 turns the control line Hnode up to the high level (source voltage VDD1). Thus, in the first output unit 61*b*, the first transistor 80 turns OFF, and the second transistor 81 turns ON, so that the reference voltage VSS2 appears at the driving output terminal 86.

At the beginning of the period (B), the first signal generator unit 93 turns the control line Qnode up to the high level (source voltage VDD1), and the second signal generator unit 94 turns the control line Hnode down to the low level (reference voltage VSS1). Thus, in the first output unit 61*b*, the first transistor 80 turns ON, and the second transistor 81 turns OFF, so that the potential of the clock signal CLK1*b* (the reference voltage VSS2) is applied to the driving output terminal 86 and remains at the reference voltage VSS2.

In the period (C), the output of the first signal generator unit 93 is high impedance (the transistors 93*a* and 93*b* are OFF), and thereby the first signal generator unit 93 is electrically disconnected from the gates (control terminals) of the first transistor 80 and the third transistor 83. Meanwhile, the second signal generator unit 94 keeps the control line Hnode at the low level (reference voltage VSS1). In addition, the clock signal CLK1*b* passing through the first transistor 80 rises, and the change in the level of the clock signal CLK1*b* is input as a positive feedback from the source to the gate of the first transistor 80 via the first capacitor 82, causing bootstrapping. This causes a rise in the potential of the gate (that is, the potential of the control terminal and the control line Qnode) of the first transistor 80, and the first transistor 80 persistently remains in ON state. As a result, the clock signal CLK1*b* output to the driving output terminal 86 is at the high level (source voltage VDD1), and thereby a signal having a sharp rise is output.

At the beginning of the period (D), the high impedance output of the first signal generator unit 93 is maintained, and the clock signal CLK1*b* passing through the first transistor 80 falls, so that the change in the level of the clock signal CLK1*b* is transmitted from the source to the gate of the first transistor 80 via the first capacitor 82. As a result, the potential of the gate of the first transistor 80 (that is, the potential of the control terminal and the control line Qnode) falls but still is at a high level (approximately the source voltage VDD1), and therefore the first transistor 80 remains in ON state. Also at the beginning of the period (D), the control line Hnode is turned up to the high level (source voltage VDD1) by the second signal generator unit 94. Consequently, the first transistor 80 and the second transistor 81 both turn ON, and charges accumulated in the driving output terminal 86 are pulled to the reference voltage VSS2 via the first transistor 80 and the second transistor 81. Then, the voltage of the driving output terminal 86 sharply falls from the source voltage VDD1 toward the reference voltage VSS2.

In the period (E), the first unit circuit 61' operates in the same manner as in the period (A). Specifically, moving out of the high-impedance state, the first signal generator unit 93 turns the control line Qnode down to the low level (reference voltage VSS1), and the second signal generator unit 94 turns the control line Hnode up to the high level (source voltage VDD1). Thus, in the first output unit 61b, the first transistor 80 turns OFF, and the second transistor turns ON, so that the reference voltage VSS2 appears at the driving output terminal 86.

In this manner, the shift register in the present embodiment is capable of outputting sharp pulses to the driving output terminal 86 by utilizing high-impedance output of the first signal generator unit 93 and bootstrapping of the first output unit 61b.

Note that FIG. 9 not only illustrates operation of the first unit circuit 61' illustrated in FIG. 6 but also substantially serves as a timing diagram illustrating operation of the first unit circuit 61 illustrated in FIG. 4. More specifically, the first unit circuit 61 illustrated in FIG. 4 also involves control of high impedance and bootstrapping via a capacitor, and thus the driving output terminal 86 outputs a signal having sharp pulses.

Figure 10:
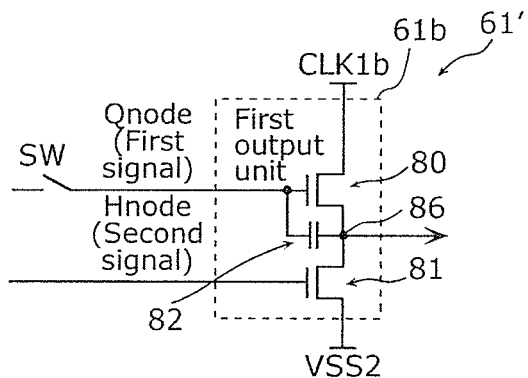
FIG. 10 is a functional circuit diagram of the first unit circuit with a focus on the first output unit.
Figure 11:
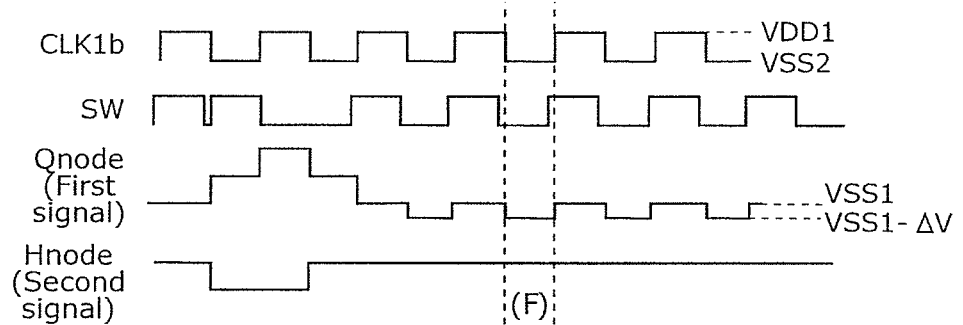
FIG. 11 is a timing diagram illustrating operation of the first unit circuit illustrated in FIG. 10.

FIG. 10 and FIG. 11 are diagrams for describing another advantageous effect of utilizing high-impedance output of the first signal generator unit 93a and are a functional circuit diagram of the first unit circuit 61' and a timing diagram illustrating operation of the the first unit circuit 61', respectively, with a focus on the first output unit 61b.

In FIG. 10 and FIG. 11, a switch SW is a schematic circuit element representing the output states (outputting state and high-impedance state) of the first signal generator unit 93. In FIG. 11, the periods in which SW is at the high level correspond to the closed state of the switch SW, that is, the "outputting" state of the first signal generator unit 93, and the periods in which SW is at the low level correspond to the open state of the switch SW, that is, the "high impedance" output state of the first signal generator unit 93.

In the period (F) in FIG. 11, the clock signal CLK1b is at the low level. The switch SW is at the low level (that is, the output of the first signal generator unit 93 is in the "high impedance state") for a predetermined period (in this case, the length of the predetermined period is equal to the length of the period in which the clock signal CLK1b is at the low level) starting immediately before the period (F). Thus, when the clock signal CLK1b passing through the first transistor 80 disconnected from the first signal generator unit 93 falls, the change in the level of the clock signal CLK1b ($\Delta V$) is transmitted to the gate of the first transistor 80 via the first capacitor 82, and thereby the potential of the gate of the first transistor 80 (that is, the potential of the control line Qnode in FIG. 11) falls from VSS1 to (VSS1−$\Delta V$) as illustrated in FIG. 11. The gate and source of the first transistor 80 are thereby inversely biased (Vgs<0), so that through-current of the first transistor 80 is suppressed.

In this manner, the first signal generator unit 93 and the gate of the first transistor 80 are electrically disconnected for a predetermined period starting immediately before the clock signal CLK1b changes to the low level, so that through-current in the first transistor 80 is suppressed. In a shift register having such a functionality, through-current of the first transistor 80 is suppressed in addition to through-current of the second transistor 81, so that the shift register requires far less power to operate.

FIG. 11 not only illustrates operation of the first unit circuit 61' illustrated in FIG. 6 but also substantially serves as a timing diagram illustrating operation of the first unit circuit 61 illustrated in FIG. 4. More specifically, the potential of the control line Qnode in the first unit circuit 61 illustrated in FIG. 4 also has a waveform illustrated in FIG. 11, so that through-current in the first transistor 80 is suppressed.

In this manner, the shift register in the present embodiment includes unit circuits each having an output stage including a first output unit which outputs a driving signal and a second output unit which outputs a signal to the next unit circuit in the cascade. Furthermore, the first transistor 80 and the second transistor 81 included in the first output unit has a current supply capability larger than the current supply potential of the third transistor 83 and the fourth transistor 84 included in the second output unit, and the reference voltage VSS2 of the first output unit is set at a potential higher than the reference voltage VSS1 of the second output unit.

With this, the first output unit, which drives a larger load, has a current supply capability larger than the current supply capability of the second output unit. At the same time, in the first output unit, which is likely to have a large through-current, the gate-source voltage Vgs input to turn the second transistor 81 OFF is a voltage biased more inversely than the voltage of the second output unit. Thus, through-current of the second transistor 81 is suppressed when the second transistor 81 is OFF.

In this manner, the first signal generator unit 93 and the gate of the first transistor 80 are electrically disconnected for a predetermined period starting immediately before the clock signal CLK1b changes to the low level, so that through-current of the first transistor 80 is suppressed. Thus, through-current in the first transistor 80 is suppressed in addition to through-current in the second transistor 81, so that the shift register requires far less power to operate.

Figure 12:
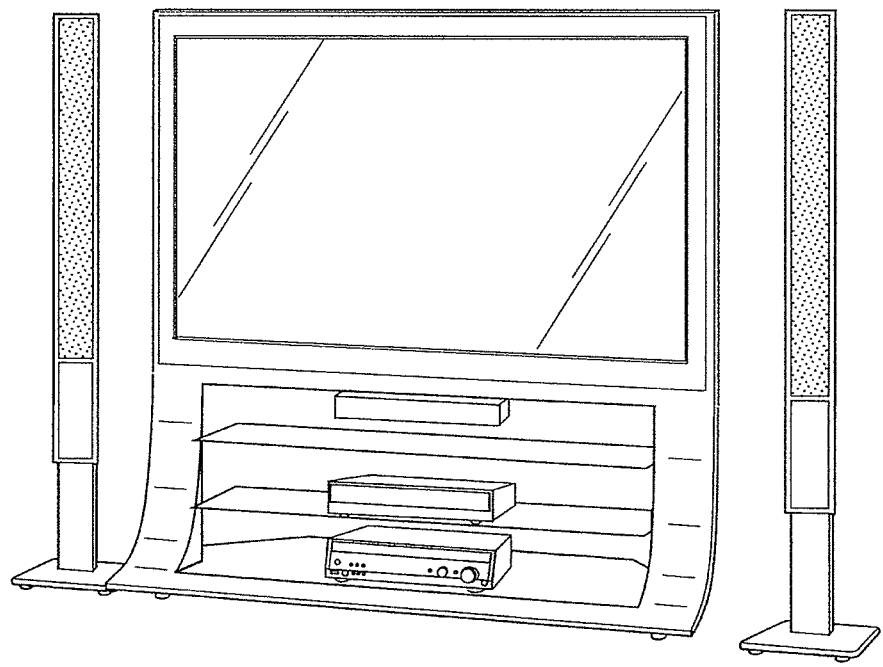
FIG. 12 is an external view of a display device according to the present invention.
Figure 13:
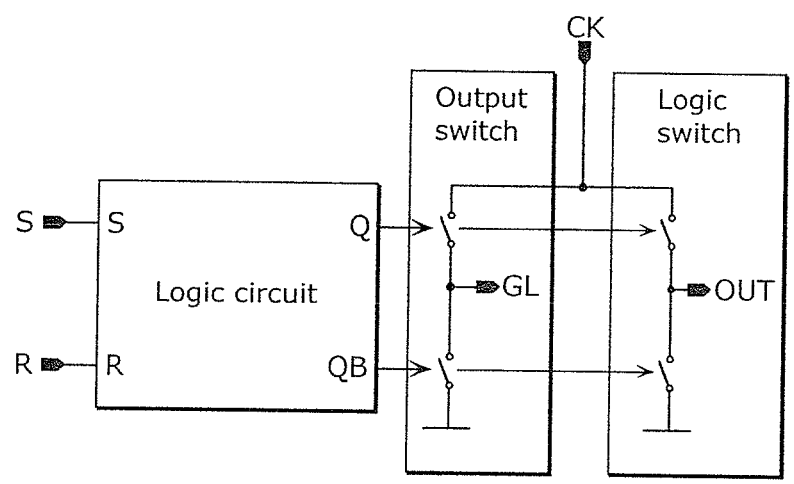
FIG. 13 is a circuit diagram illustrating a unit circuit of a conventional shift register.

A display device in the present embodiment includes: (1) a scan line driving circuit 50 including a low-power-consumption shift register having the above-described features; (2) scan lines 51 for transmitting driving signals output from the scan line driving circuit 50; (3) signal lines 41 which cross the scan line 51 and transmit a video signal; and (4) a display unit 30 including pixel circuits 31 each of which is disposed at a different one of crosspoints of the scan lines 51 and the signal lines 41 and, under control of the driving signals, emits light corresponding to the video signal. Thus, the display device in the present embodiment operates with far less power. Such a low-power-consumption display device is useful as a display for television (TV) receiver as illustrated in FIG. 12, for example.

The shift register and the display device according to the present invention have been described above based on an embodiment, but the present invention is not limited to the embodiment. The scope of the present invention also includes variations of the present embodiment, embodiments which those skilled in the art configures by modifying these embodiments, and embodiments configured by combining components in such present embodiments unless they depart from the spirit and scope of the present invention.

For example, the display device according to the present invention is not limited to the display device 10 in the present embodiment including the scan line driving circuit 50 having only a single type of the shift registers 60 as in the present embodiment. When the pixel circuit 31 included in the display unit 30 requires two or more types of control signals, the scan line driving circuit may include two or more types of shift registers.

The shift register according to the present invention is not limited to the shift register including transistors which are n-type transistors as in the present embodiment. The shift register may include only p-type transistors or may include both n-type and p-type transistors. In such cases, the transistors in the first output unit need to be configured so that the gate-source voltage Vgs is inversely biased when the transistors turn OFF. The n-type transistors may be transistors having a semiconductor layer of silicon or an oxide, and the structure of the transistors is not specifically limited.

Furthermore, the transistors included in the shift registers according to the present invention need not be depletion-mode transistors. The present invention is useful especially for shift registers including depletion-mode transistors. However, the present invention still allows for reduction in power consumption of shift registers including non-depletion-mode transistors compared to conventional techniques as shown in FIG. 5 and FIG. 7.

INDUSTRIAL APPLICABILITY

The present invention is usable as a shift register, a scan line driving circuit including such a shift register, and a display device including such a scan line driving circuit and, in particular, as a shift register, a scan line driving circuit, and a display device which operate with low power, such as an organic EL display device used in a television, a computer, and an illuminating device.

REFERENCE SIGNS LIST

10 Display device
20 Control circuit
30 Display unit
31 Pixel circuit
32 to 34 Switching transistor
35 Driving transistor
36 Organic EL device
37, 82, 85, 96 to 98 Capacitor
40 Signal line driving circuit
41 Signal line
50 Scan line driving circuit
51, 51a, 51b, 51c Scan line
60 Shift register
61 to 63 Unit circuit
61a, 62a, 63a Logic circuit
61b, 62b, 63b First output unit
61c, 62c, 63c Second output unit
80 First transistor
81 Second transistor
83 Third transistor
84 Fourth transistor
86 Driving output terminal
87 Output-to-next terminal
91, 92, 93a to 93d, 94a, 94b, 95a, 95b Transistor
93 First signal generator unit
94 Second signal generator unit

The invention claimed is:

1. A shift register, comprising:
unit circuits connected in a cascade, the unit circuits each including a first output unit, a second output unit, and a logic circuit,
the first output unit including a driving output terminal for outputting a driving signal; a first transistor for applying a first voltage to the driving output terminal; and a second transistor for applying a second voltage lower than the first voltage to the driving output terminal,
the second output unit including an output-to-next terminal for outputting a signal to a next unit circuit in the cascade; a third transistor for applying a third voltage to the output-to-next terminal; and a fourth transistor for applying a fourth voltage lower than the third voltage to the output-to-next terminal, and
the logic circuit including a first signal generator unit configured to generate a first signal for switching the first transistor and the third transistor between a conducting state and a non-conducting state according to the signal provided from a preceding unit circuit in the cascade; and a second signal generator unit configured to generate a second signal for switching the second transistor and the fourth transistor between the conducting state and the non-conducting state according to the signal provided from the preceding unit circuit in the cascade,
wherein the first transistor and the second transistor each have a current supply capability larger than a current supply capability of the third transistor and a current supply capability of the fourth transistor,
the second voltage is set at a fixed potential higher than the fourth voltage,
the first transistor includes a control terminal to which the first signal is input, a first output terminal, and a second output terminal connected to the driving output terminal,
the first output terminal is connected to a signal source of a clock signal having a high level at the first voltage and a low level at a voltage lower than the first voltage,
the logic circuit electrically disconnects the control terminal and the first signal generator at least for a predetermined period starting immediately before the clock signal changes from the high level to the low level,
the predetermined period including a low level period after the clock signal changes from the high level to the low level, the low level period being a period during which the clock signal continues to have the low level, and
the first transistor remains in the conducting state and the second transistor is turned up to the conducting state by the second signal generator in the low level period.

2. The shift register according to claim 1,
wherein the logic circuit is connected to a high voltage source and a low voltage source for generating the first signal and the second signal, and
the fourth voltage is set at a potential same as output voltage of the low voltage source.

3. The shift register according to claim 2, further comprising:
a capacitor connected between the control terminal and the second output terminal of the first transistor,
wherein potential of the control terminal changes from the fourth voltage to a voltage lower than the fourth voltage when the clock signal changes to the low level.

4. The shift register according to claim 2,
wherein the low level is a potential same as the fourth voltage.

5. A display device comprising:
ft register according to claim 1;
scan lines for transmitting driving signals output from the shift register;

signal lines for transmitting a video signal, the signal lines, the signal lines crossing the scan lines; and a display including pixel circuits each of which is disposed at a different one of crosspoints of the scan lines and the signal lines and, under control of the driving signals, emits light corresponding to the video signal.

* * * * *